(12) United States Patent
Camlica

(10) Patent No.: US 12,201,027 B2
(45) Date of Patent: Jan. 14, 2025

(54) ACTUATOR MECHANISM

(71) Applicant: TUSAS-TURK HAVACILIK VE UZAY SANAYII ANONIM SIRKETI, Ankara (TR)

(72) Inventor: Fahri Bugra Camlica, Ankara (TR)

(73) Assignee: TUSAS-TURK HAVACILIK VE UZAY SANAYII ANONIM SIRKETI, Ankara (TR)

( * ) Notice: Subject to any disclaimer, the term of this patent is extended or adjusted under 35 U.S.C. 154(b) by 202 days.

(21) Appl. No.: 18/015,871

(22) PCT Filed: Apr. 15, 2021

(86) PCT No.: PCT/TR2021/050354
§ 371 (c)(1),
(2) Date: Jan. 12, 2023

(87) PCT Pub. No.: WO2022/019852
PCT Pub. Date: Jan. 27, 2022

(65) Prior Publication Data
US 2023/0309408 A1    Sep. 28, 2023

(30) Foreign Application Priority Data

Jul. 23, 2020 (TR) ................. 2020/11726

(51) Int. Cl.
*H10N 30/20*    (2023.01)
*B64C 3/38*    (2006.01)
*B64C 13/50*    (2006.01)
*F03G 7/00*    (2006.01)
*H10N 30/857*    (2023.01)

(52) U.S. Cl.
CPC ............. *H10N 30/206* (2023.02); *B64C 3/38* (2013.01); *B64C 13/50* (2013.01); *F03G 7/0121* (2021.08); *H10N 30/857* (2023.02)

(58) Field of Classification Search
CPC ........................................ H10N 30/00–30/886
See application file for complete search history.

(56) References Cited

U.S. PATENT DOCUMENTS 6,545,384 B1    4/2003    Pelrine et al.
2017/0203829 A1    7/2017    Brown et al.

FOREIGN PATENT DOCUMENTS

EP    2233735 A2    9/2010
WO    03107523 A1    12/2003
(Continued)

OTHER PUBLICATIONS

International Search Report and Written Opinion for PCT application No. PCT/TR2021/050354, mailed Oct. 22, 2021.
(Continued)

*Primary Examiner* — Ramon M Barrera
(74) *Attorney, Agent, or Firm* — Notaro, Michalos & Zaccaria P.C.

(57) ABSTRACT

An actuator mechanism for a body is disclosed. The actuator mechanism has at least one actuator produced from an electro-active polymer material that changes form due to electrical energy, thereby actuating the body The actuator mechanism also has at least two strengtheners allowing the actuator to change its form, each holding the actuator from a different side, and positioned oppositely on the body The actuator mechanism further has at least one retainer tip holding the actuator from at least one side thereof.

14 Claims, 6 Drawing Sheets

(56) References Cited

FOREIGN PATENT DOCUMENTS

Figure 1:
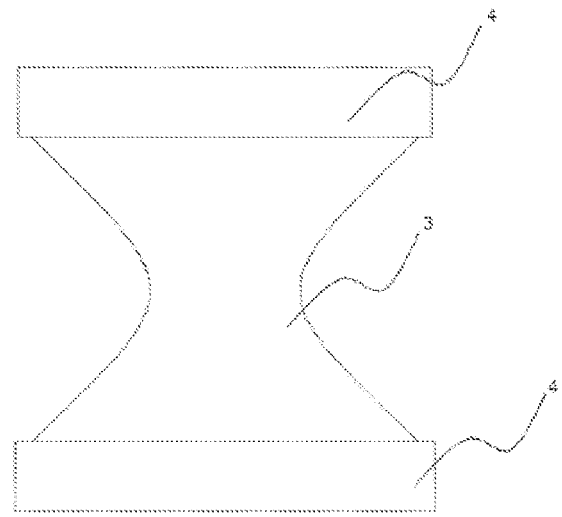

WO   2013015503 A1   1/2013
WO   2017108489 A1   6/2017

OTHER PUBLICATIONS

International Preliminary Report on Patentability, completed Nov. 28, 2022.
Demand/Request for Preliminary Examination dated May 20, 2022.
International Application Status Report generated Jan. 3, 2023.
Written Opinion of International Preliminary Examining Authority mailed Oct. 12, 2022.
Response to Written Opinion of International Preliminary Examining Authority dated Nov. 10, 2022.

ACTUATOR MECHANISM

The present invention relates to an actuator mechanism for increasing the efficiency of elastomeric actuators used in place of electrical/pneumatic/hydraulic actuators.

Electrical energy is converted into mechanical energy by means of actuators produced with elastomeric materials that structurally possess viscosity and elasticity. Actuators produced with elastomeric materials as used in artificial muscles, robotics, general automation, land, sea and air vehicle automation can be used in place of electrical/pneumatic/hydraulic actuators that take up a large volume and are difficult to integrate structurally. The elastomeric material in said dielectric structure is coated with a conductive material, voltage is applied thereto and the elastic material is enabled to deform by compression. Elastomeric actuators, which are stretched to enlarge in size, retract themselves when they are free and assume their former state. For this reason, they are attached to the systems in which they are used in a stretched form, i.e. not retracted form, and ensure that the system they are connected to move due to their deformation. During the deformation of the elastomeric actuator, the internal force of the material causes the geometry of the elastomeric actuator to deteriorate.

The German patent document EP2913859, which is included in the known state of the art, discloses a plurality of longitudinal support members with discrete ends thickening in the form of spheres or teardrops and a plurality of rolling elements working as support members. The support members are rolled and adjusted by the expansion of the elastomeric actuator.

An actuator mechanism developed by the present invention can be easily integrated into a system used thereon since its size can easily be adjusted. With the different retainer designs used, a mechanism suitable for different technological fields from medicine to aviation and space is obtained. By approaching the elastomeric film to its theoretical edge position, the accuracy of mathematical calculations increases and a mechanism with more efficient output is obtained by preventing wrinkles and material deformation.

The actuator mechanism realized to achieve the object of the invention, defined in the first claim and in the claims dependent thereon, is formed by clamping the actuator, which is flexible and insulating, onto a body from its two opposite sides by means of strengtheners. According to the requirements, the actuator used can be clamped in a multiple number in a superimposed or side-by-side form by being stretched by the strengtheners. When electrical energy is applied to the actuator produced with an electro-active polymer material, the motion that depends on the deformation of the actuator is transmitted to the body by means of strengtheners that do not limit the deformation. While the actuator changes its form, the actuator is pinched and held by means of retaining tips to prevent it from distorting its geometric shape and from not complying with mathematical calculations and to avoid a decrease in its output efficiency.

The actuator mechanism of the invention has retainers attached to oppositely-placed strengtheners and a first position in which the actuator and the retainer are stretched in a mutual form compliance by pulling the actuator with the retaining tips and detachably attaching the retaining tips to the retainer. Thus, when the actuator is not energized, the retainer in the first position is form compatible with the actuator. When the actuator is energized, its form changes and the retainer connected to the strengtheners comes from the first position to a second position to almost limit this form change.

In an embodiment of the invention, the actuator mechanism comprises a retainer located between oppositely positioned strengtheners each holding the actuator from a different side and extending between the strengtheners by attaching one end thereof to a strengthener and the other end thereof to the other strengthener. It is aimed to preserve the geometric shape of the actuator using the retainer and when the actuator is triggered, the efficiency of the output obtained is increased by limiting the form change.

In an embodiment of the invention, the actuator mechanism comprises a retainer tip that enables to clamp, pull and stretch on the retainer the side of the actuator that is close to the retainer, is slidably inserted into the retainer and can slide into the retainer with the deformation of the actuator. Using the retainer tips, the actuator can be stretched on the retainer without being permanently deformed.

In an embodiment of the invention, the actuator mechanism comprises retaining tips that enable the side of the actuator that is close to the retainer to be pinched at equal distances between themselves. When the retainer moves from the first position to the second position or from the second position to the first position, the distance between the retainer tips remains almost equal with the retainer tips sliding in the retainer while the actuator changes its form. Thus, when it is attempted to restrict the form change with the retainer tips pulling the actuator, i.e. when it is switched to the second position, the pulling force is applied at equal intervals to prevent the actuator from deforming, wrinkling and bending irreversibly.

In an embodiment of the invention, the actuator mechanism comprises a curved and flexible retainer with a concave or convex form, to which the actuator is attached, one side thereof being connected to one of the oppositely positioned strengtheners and the other side thereof to the other strengthener. The side of the actuator that is close to the retainer is stretched on the curved retainer in the first position in line with the geometric shape of the retainer with the help of the retaining tips. During the time the actuator is compressed and elongated when it is energized, the strengtheners move away from each other and the curved retainer structure on the strengtheners stretches and moves to the second position where it almost becomes flat. In this way, the retainer tips are enabled to slide inside the retainer and to apply force to the actuator and the actuator becomes almost flat in form compliance with the retainer. When the actuator is not energized, the retainer moves from the second position where it is almost in a flat form to the first position where it is concave or convex. The retainer can be manufactured from any of stretchable materials such as foam, thermoplastic, thermoset, composite or cork.

In an embodiment of the invention, the actuator mechanism comprises a telescopic retainer mounted to the strengtheners mutually holding the actuator and extending telescopically while the strengtheners move away from each other when the actuator is energized. When the actuator is not triggered by electrical energy, the side of the actuator that is close to the retainer is stretched almost in a flat form in line with the telescopic retainer. During the elongation of the telescopic holder, it is enabled to pull the actuator connected to the telescopic retainer with sliding retainer tips so as to ensure that the actuator, which is prone to form change, remains almost flat in line with the retainer that is switched to the second position during elongation. In the event that the actuator is not energized, the retainer switches from the second position, which it assumes by being telescopically extended, to the first position, which it assumes by being telescopically retracted.

In an embodiment of the invention, the actuator mechanism comprises a sliding retainer, which is mounted to two mutual strengtheners to which the actuator is connected, which, when the actuator is not energized, is stretched almost flat so that it is form compatible with the retainer and thus assumes its first position, and which can slide in the section of the strengthener to which it is attached so that any wrinkling caused by the internal force effect of the actuator as the actuator is elongated are maintained almost flat and thus assumes its second position. If the actuator is not energized, the retainer switches from the second position to which it came in a sliding manner to the first position in a sliding manner.

In an embodiment of the invention, the retainer produced from shape memory alloy is enabled to switch from the first position to the second position or from the second position to the first position with electrical energy or heat energy transmitted by the control unit to the retainer.

In an embodiment of the invention, the actuator mechanism comprises a retainer tip that enables the side of the actuator that is close to the retainer to be tightly held along its length and that is slidably fitted into the retainer, and which changes its form in compliance with the retainer by being stretched during the retainer's transition from the first position to the second position or from the second position to the first position.

In an embodiment of the invention, the actuator mechanism comprises a retaining tip that is produced from an elastic material to be able to adapt to form changes.

In an embodiment of the present invention, the actuator mechanism's retaining tips are produced in a serrated manner so that the friction force is increased while the retaining tips pinch the actuator.

In an embodiment of the present invention, the actuator mechanism comprises an actuator, elastomeric film that can flexibly deform and conductive layers that are conductive on both surfaces of the elastomeric film and that can be deformed in line with the deformation of the elastomeric film. Conductive layers can usually be in powder form or in the form of a thin metal film. With the potential applied to the conductive layers by the control unit, positive and negative conductive layers cause the generation of an electric field and enable the dielectric elastomeric film staying between the conductive layers to be pinched. The thickness of the pinched elastomeric film decreases with its length increasing. Thus, the actuator is enabled to change its form and the body is enabled to move by means of the strengtheners.

In an embodiment of the invention, the actuator mechanism comprises a conductive layer with conductive property, formed from any of silicone/graphite, carbon conductive grease, carbon-based or silver grease material which covers both surfaces of the elastomeric film and can deform in line with the elastomeric film while it enables the elastomeric film to be compressed.

In an embodiment of the present invention, the actuator mechanism comprises an actuator providing the actuation of a control surface of an air vehicle to enable a body on the air vehicle to move. Thus, the mechanical energy of the control surface is provided using a more lightweight structure.

The actuator mechanism realized to achieve the object of the present invention is shown in the accompanying figures, among which:

FIG. 1—is a top view of an actuator stretched with strengtheners.

Figure 2:
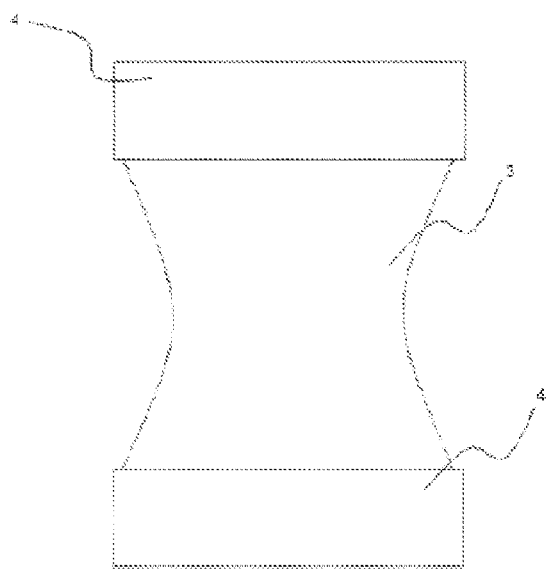

FIG. 2—is a top view of the electrically energized actuator.

Figure 3:
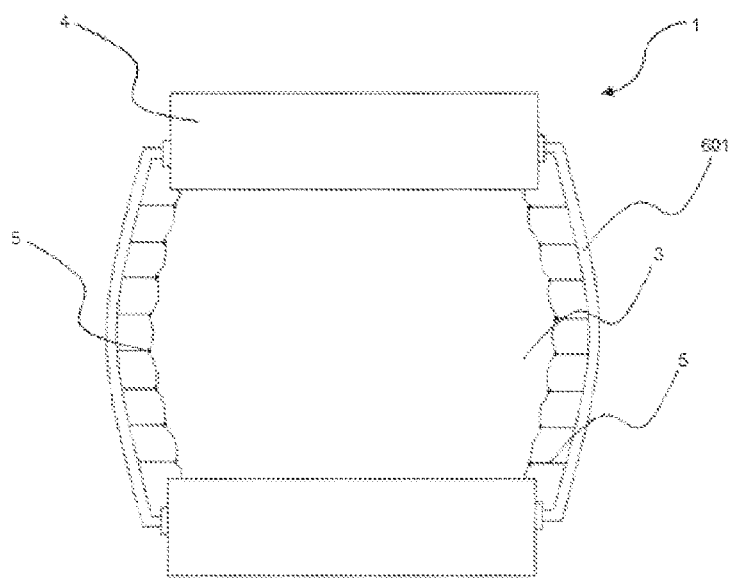

FIG. 3—is a top view of the actuator mechanism when the convexly curved retainer is in the first position.

Figure 4:
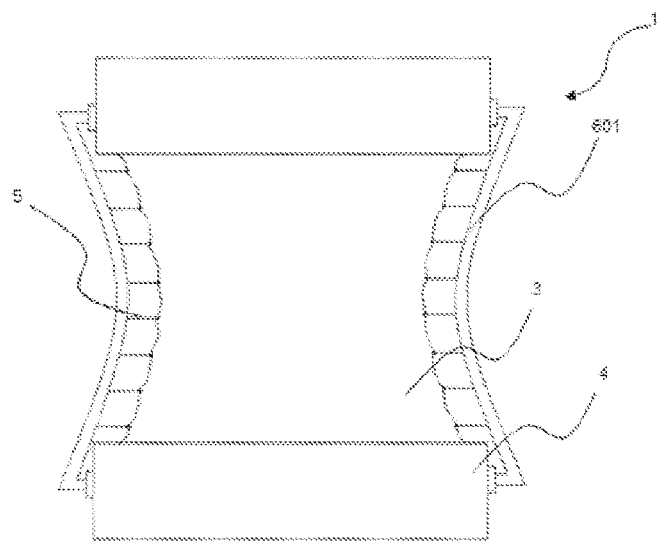

FIG. 4—is a top view of the actuator mechanism when the concavely curved retainer is in the first position.

FIG. 5—is a top view of the actuator mechanism when the curved retainer is in the second position.

Figure 6:
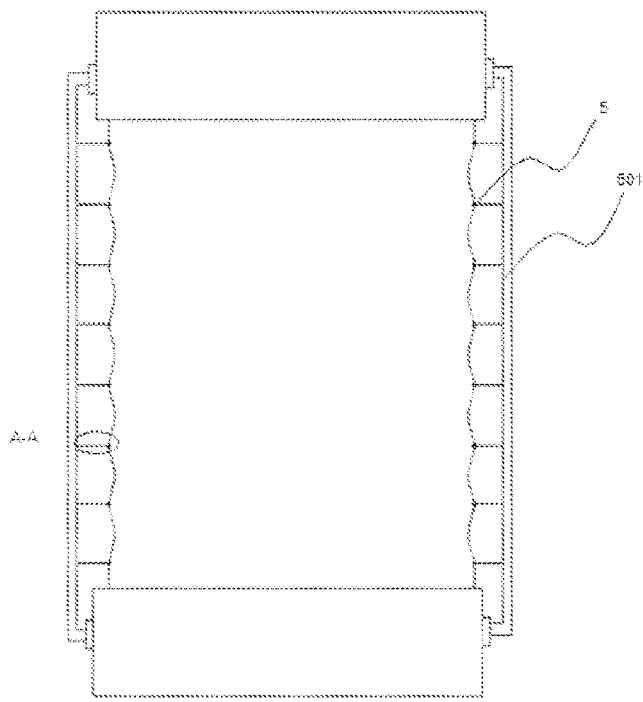
Figure 6:
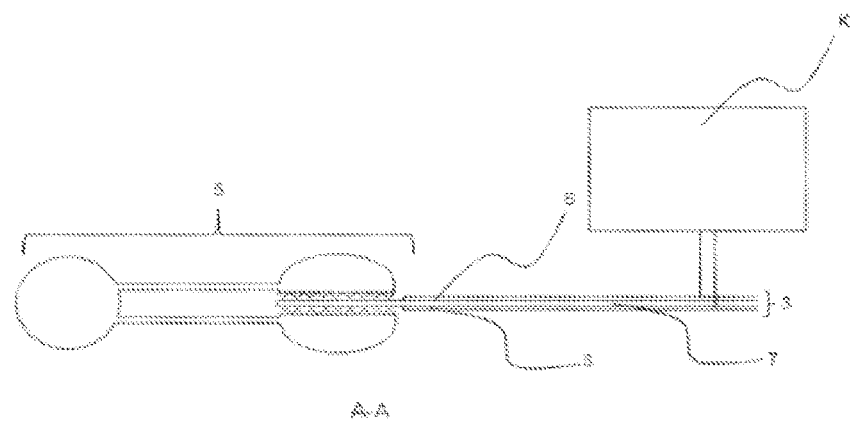

FIG. 6—is a cross-sectional view of section A-A in FIG. 5.

Figure 7:
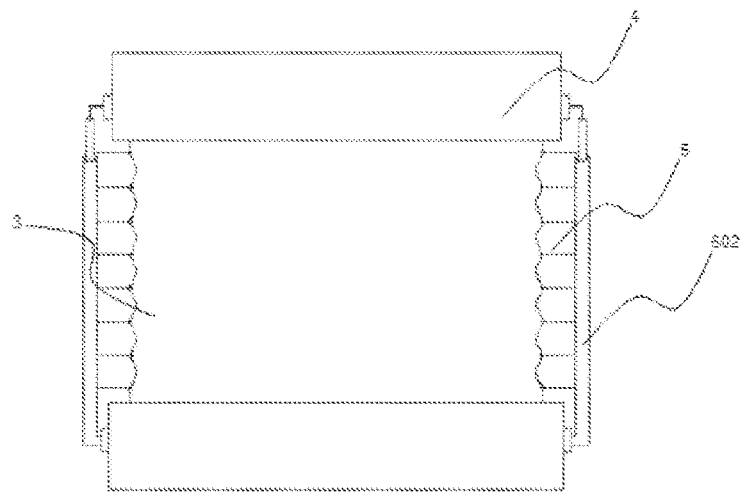

FIG. 7—is a top view of the actuator mechanism when the telescopic retainer is in the first position.

Figure 8:
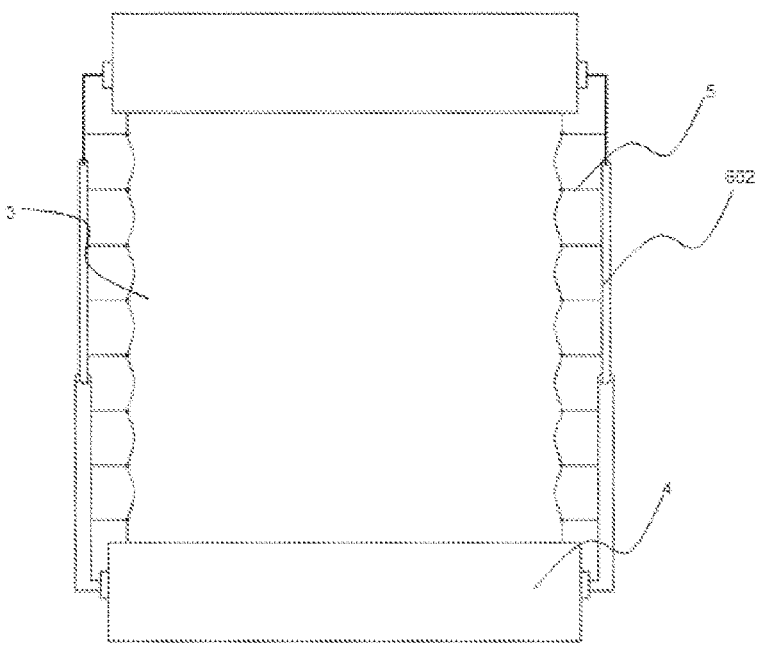

FIG. 8—is a top view of the actuator mechanism when the telescopic retainer is in the second position.

Figure 9:
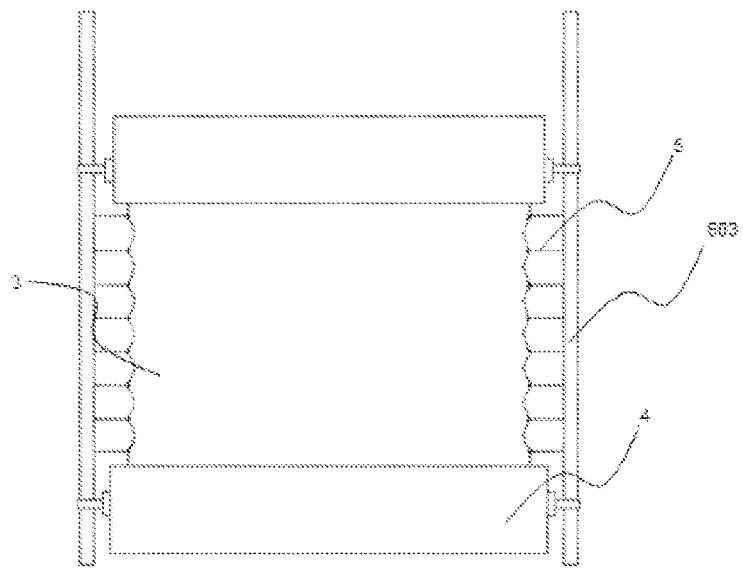

FIG. 9—is a top view of the actuator mechanism when the sliding retainer is in the first position.

Figure 10:
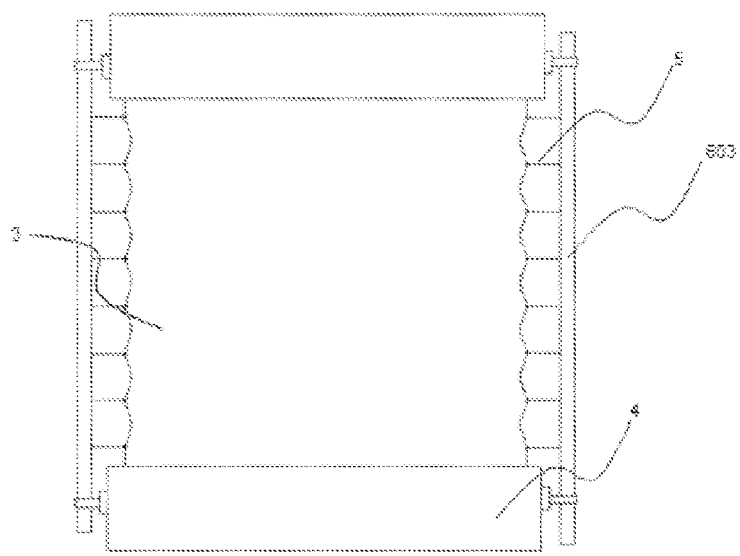

FIG. 10—is a top view of the actuator mechanism when the sliding retainer is in the second position.

Figure 11:
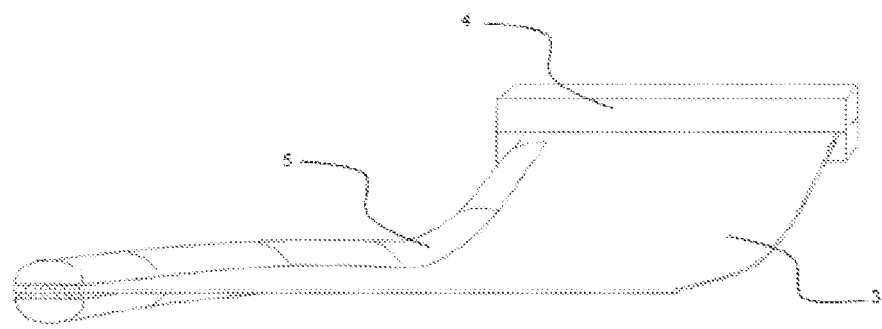

FIG. 11—is a perspective view of the retainer tip.

Figure 12:
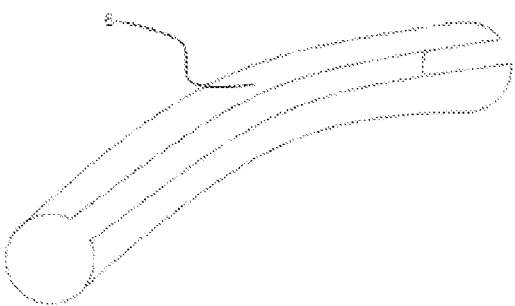

FIG. 12—is a perspective illustration of the retainer.

Figure 13:
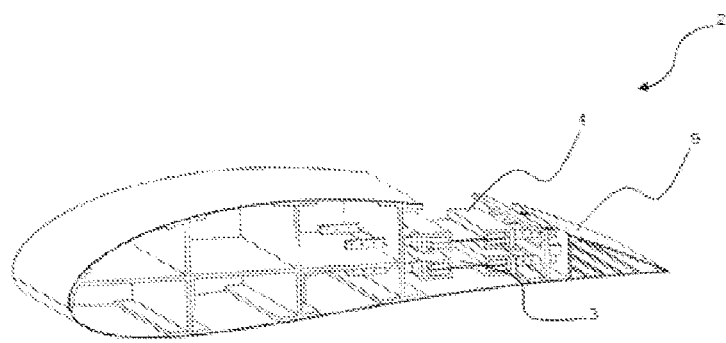

FIG. 13—is a perspective view of the body.

All the parts illustrated in figures are individually assigned a reference numeral and the corresponding terms of these numbers are listed below:

1. Actuator Mechanism
2. Body
3. Actuator
4. Strengthener
5. Retainer Tip
6. Retainer
601. Curved Retainer
602. Telescopic Retainer
603. Sliding Retainer
7. Elastomeric Film
8. Conductive Layer
9. Control Surface
(K) Control Unit The actuator mechanism (1) comprises a body (2), at least one actuator (3) produced with an electro-active polymer material that changes form due to electrical energy, thereby actuating the body (2), at least two strengtheners (4) allowing the actuator (3) to change its form, each retaining the actuator (3) from a different side, and mutually positioned on the body (2), and at least one retainer tip (5) retaining the actuator (3) from at least one side thereof (FIG. 1, FIG. 2).

The actuator mechanism (1) comprises at least one retainer (6), which is detachably attached to two mutual strengtheners (4), to which the retainer tips (5) holding the actuator (3) are detachably attached, and which has a first position (I) in which it stretches the actuator (3) in a form compatible manner when the actuator (3) is not energized, and at least one holder (6) which has a second position (II) in which it enables an almost complete limitation of the form change of the actuator (3) coming from the first position (I) when the actuator (3) is not energized. (FIG. 3. FIG. 4, FIG. 5, FIG. 7, FIG. 8, FIG. 9, FIG. 10)

The actuator (3) is brought to a stretched state by being clamped from its two opposite edges by means of the strengtheners (4) attached to the body (2). The actuator (3) is stretched from its opposite edges by means of the strengtheners (4), which must be at least two in number. The stretching process referred to herein is the damping of the actuator (3) by means of the strengtheners (4) to a tensioned form so that almost no curling or shrinking remains on the actuator. An electric field is generated with the potential applied to the actuator (3) by the control unit (K) and the actuator (3) changes its form under the effect of the generated electric field. The form change of the actuator (3) means that it is compressed to become thinner and its length is increased. The form change of the actuator (3) is not limited by the strengtheners (4) located on the body (2) and the mechanical energy generated with the actuator (3) changing its form is transmitted to the body (2) by means of the strengtheners (4). The actuator (3) is secured by being tightened with one or more retaining tips (5) at equal or free intervals.

The retainer tips (5) holding by pinching the actuator (3) enable the actuator (3) to be pulled and connected to the retainer (6). The geometric form of the retainer (6) may be linear, concave or convex and while the actuator (3) is stretched to the retainer (6) by means of the holding tips (5), the stretching here is provided in line with the form of the retainer (6). In other words, the side of the actuator (3) that is close to the retainer is compatible with the geometry of the retainer (6) in the first position (I), in which no electricity is applied to the actuator mechanism (1) and the actuator (3) is stretched from its two opposite edges by means of the strengtheners (4) and is connected to the retainer (6) by the retainer tips (5). When electricity is applied to the actuator mechanism (1) by the control unit (K), the side of the compressed and elongated actuator (3), which tends to be inwardly retracted and which is fixed to the retainer (6) by the retainer tips (5), is almost confined when the retainer (6) comes to the second position (II) and the output efficiency of the actuator mechanism (1) is increased.

In an embodiment of the invention, the actuator mechanism (1) comprises a retainer (6) extending between two oppositely positioned strengtheners (4), one end of the retainer being mounted to a strengthener (4) and the other end thereof to the other strengthener (4). The retainer (6) extends between the mutually positioned strengtheners (4) and enable to limit the deformation of the actuator (3).

In an embodiment of the invention, the actuator mechanism (1) comprises a retainer tip (5) located between the actuator (3) and the retainer (6), holding by pinching the side of the actuator (3) close to the retainer (6), slidingly placed into the retainer (6) and sliding in the retainer (6) with the actuator (3) changing its form as a function of electrical energy. In order for the deformation of the actuator (3), when it is energized or not energized, to take place in compliance with the form of the retainer (6), the actuator (3) is held with the retainer tips (5) and the retainer tips (5) are slidingly placed in the retainer (6). With the retainer tips (5) sliding in the retainer (6), it is enabled to avoid negative situations such as the wrinkling, buckling of the actuator (3). (FIG. 12)

In an embodiment of the invention, the actuator mechanism (1) comprises more than one retainer tip (5) holding by pinching the actuator (3) at equal intervals and with the actuator (3) changing its form, enabling the distance between them to remain equal by sliding in the retainer (6). It is ensured that the actuator (3) is not permanently deformed with at least two discrete retainer tips (5) holding by pinching the actuator (3) at equal distances between them.

In an embodiment of the invention, the actuator mechanism (1) comprises a flexible curved retainer (601) having a concave or convex form and becoming almost flat when the actuator (3) is energized. When the shape of the retainer (6) is concave, the side of the actuator (3) close to the curved retainer (601) is held and pulled by the retainer tips (5) and stretched in the form of the concave curved retainer (601) so that the curved retainer (601) is brought to the first position (I). When the shape of the retainer (6) is concave, in turn, the side of the actuator (3) close to the curved retainer (601) is connected to the curved retainer (601) by the retainer tips (5) and stretched in the form of the convex curved retainer (601) so that the curved retainer (601) is brought to the first position (I). The curved retainer (601) with a concave or convex form is mounted to the strengtheners (4) that clamp the actuator (3) from two opposite sides thereof. With the elongation of the actuator (3), the curved retainer (601) becomes almost flat with the strengtheners (4) moving away from each other, that is, it switches to the second position (II). In this way, the side of the actuator (3) stretched to the curved retainer (601) becomes almost flat by means of the retainer tips (5) moving together with the curved retainer (601). When no electrical energy is supplied to the actuator (3), the curved retainer (601) switches from the second position (II) in which it is almost in a flat form to the first position (I) in which it is concave or convex. (FIG. 3, FIG. 4, FIG. 5)

In an embodiment of the invention, the actuator mechanism (1) comprises a telescopic retainer (602) that extends telescopically when the actuator (3) is energized. In the design of the telescopic retainer (602) that extends telescopically since it is mounted to the strengtheners (4) that move away from each other when the length of the actuator (3) is increased, it is ensured that the actuator (3) which is stretched almost flat to the telescopic retainer (602) by means of the retainer tips (5) in the first position (I) of the curved retainer (602) remains almost flat when a potential is applied or not by the control unit (K). In the case that the actuator (3) is not energized by the control unit (K), the telescopic retainer (602) switches from the second position (II) which it assumes by being telescopically extended to the first position (I) which it assumes by being telescopically retracted (FIG. 7. FIG. 8).

In an embodiment of the invention, the actuator mechanism (1) comprises a sliding retainer (603) sliding from the point where it is connected to the strengtheners (4) with the actuator (3) being energized. The actuator (3) is connected to the sliding retainer (603) by means of retainer tips (5). The sliding retainer (603) attached to the strengtheners (4) slides away from the connection point where it is attached to the strengtheners (4) that move away from each other during the extension of the actuator (3) and thus the side of the actuator (3) that is close to the sliding retainer (603) remains almost flat that it is form-compatible with the sliding retainer (603). If the actuator (3) is not energized, the sliding retainer (603) switches from the second position (II) to which it comes in a sliding manner to the first position (I) to which it comes in a sliding manner. (FIG. 9, FIG. 10)

In an embodiment of the invention, the actuator mechanism (1) comprises a retainer (6) produced from a shape memory alloy. The retainer (6) produced with a shape memory alloy is triggered by the control unit (K) and switches from the first position (I) to the second position (II) and from the second position (II) to the first position (I).

In an embodiment of the invention, the actuator mechanism (1) comprises a retainer tip (5) located between the actuator (3) and the retainer (6), holding by pinching the side of the actuator (3) close to the retainer (6) along its length, having a flexible structure and slidingly placed into the retainer (6). When the retainer tip (5) is slidingly placed into the retainer (6), said retainer tip being able to stretch in line with the form change of the actuator (3) when it is energized and to contract in form compliance with the actuator (3) when it is not energized, as well as to hold by pinching the actuator (3) from its side that is close to the retainer (6) along its length, the retainer (6) continuously stretches the actuator (3) in the first position (I), and when the retainer (6) is in the second position (II), it continuously holds the actuator (3) so that the narrowing of the surface area of the actuator is limited (FIG. 11)

In an embodiment of the invention, the actuator mechanism (1) comprises a retainer tip (5) produced with an elastic material.

In an embodiment of the invention, the actuator mechanism (1) comprises a retainer tip (5) of which the surface holding the actuator (3) is serrated so that its retaining strength increased. The use of a serrated retainer tip (5) enables to increase the friction force to prevent the actuator (3) from sliding away. (FIG. 11)

In an embodiment of the invention, the actuator mechanism (1) comprises an actuator (3) having at least one elastomeric film (7) with a dielectric structure and at least two conductive layers (8) coated on the elastomeric film (7) and enabling the elastomeric film (7) to change its shape under the electric field effect caused by a voltage applied to it by a control unit (K). At least one elastomeric film (7) provided in the structure of the actuator (3) can stretch and exhibits insulating properties when an electric field is applied to it, wherein said elastomeric film can be laminated one over the other or placed side by side. The conductive layers (8) disposed in the form of a thin metal film or in the form of powder/oil on the surfaces of the elastomeric film (7) so as to stay in contact with the surfaces can change their shape in compliance with the form change of the elastomeric film (7). In this way, an uninterrupted operation of the actuator mechanism (1) is ensured without losing the conductivity properties. With the voltage applied to the conductive layers (8) by the control unit (K), the conductive layers (8) are positively-negatively charged and cause an electric field to be generated between them. The actuator (3) generates mechanical energy when the elastomeric film (7) is compressed so that its thickness is reduced and its length is increased with the conductive layers (8) approaching each other under the effect of the electric field. (FIG. 6)

In an embodiment of the invention, the actuator mechanism (1) comprises a conductive layer (8) which can be at least one of silicone/graphite, carbon conductive grease, carbon-based or silver grease material that can change its form together with the elastomeric film (7) when the elastomeric film (7) changes its form, but still maintains its conductivity property. When voltage is applied by the control unit (K), the conductive layer (8) compresses the elastomeric film (7) and can be deformed in the same way as the elastomeric film. When the elastomeric film (7) is energized or not, it can change its form in compliance with the elastomeric film (7). Thus, the conductive layer (8) contacts the elastomeric film (7) surfaces without losing its conductivity property.

In an embodiment of the invention, the actuator mechanism (1) comprises at least one control surface (9) located on a body (2) of an air vehicle and enabling to control the air flow by making a relative movement with respect to the body (2) when the actuator (3) changes its form. When the actuator (3) is energized by the control unit (K) and changes its form, it is enabled to move the control surface (9) and this movement enables to control the flight direction of the air vehicle and its position with respect to the earth. (FIG. 13)

The invention claimed is:
1. An actuator mechanism (1) comprising:
a body (2),
at least one actuator (3) produced from an electro-active polymer material that changes form due to electrical energy, thereby actuating the body (2),
at least two strengtheners (4) allowing the actuator (3) to change its form, each holding the actuator (3) from a different side, and positioned oppositely on the body (2),
at least one retainer tip (5) holding the actuator (3) from at least one side thereof,
at least one retainer (6), which is mounted to two opposite strengtheners (4), to which the retainer tips (5) enabling to hold the actuator (3) are detachably attached, and to which the actuator (3) is secured by being tightened with more than one retaining tips (5) at intervals,
wherein the retainer (6) has a first position (I) such that when the actuator (3) is not energized, the actuator (3) is stretched via the retainer (6) by ensuring the side of the actuator (3) that is close to the retainer (6) is compatible with the geometry of the retainer (6) and
wherein the retainer (6) has a second position (II) such that it enables limitation of the form change of the actuator (3) coming from the first position (I) when the actuator (3) is energized.

2. An actuator mechanism (1) as claimed in claim 1, wherein the retainer (6) extends between two oppositely positioned strengtheners (4), one end of the retainer being mounted to one strengthener (4) and the other end thereof to the other strengthener (4).

3. An actuator mechanism (1) as claimed in claim 1 wherein the retainer tip (5) which is located between the actuator (3) and the retainer (6), holds by pinching the side of the actuator (3) that is close to the retainer (6), is slidingly placed into the retainer (6) and slides in the retainer (6) with the actuator (3) changing its form as a function of electrical energy.

4. An actuator mechanism (1) according to claim 1, comprising more than one retainer tip (5) which holds by pinching the actuator (3) at equal intervals and when the actuator (3) changes its form, enables the distance between them to remain equal by sliding in the retainer (6).

5. An actuator mechanism (1) according to claim 1, comprising a flexible curved retainer (601) which has a concave or convex form and becomes almost flat when the actuator (3) is energized.

6. An actuator mechanism (1) according to claim 1, comprising a telescopic retainer (602) that extends telescopically when the actuator (3) is energized.

7. An actuator mechanism (1) according to claim 1, comprising a sliding retainer (603) sliding from the point where it is connected to the strengtheners (4) when the actuator (3) is energized.

8. An actuator mechanism (1) according to claim 1, wherein the retainer (6) is produced from a shape memory alloy.

9. An actuator mechanism (1) according to claim 1, wherein the retainer tip (5), which is located between the actuator (3) and the retainer (6), holds by pinching the side of the actuator (3) close to the retainer (6) along its length and has a flexible structure and is slidingly placed into the retainer (6).

10. An actuator mechanism (1) according to claim 1, wherein the retainer tip (5) is produced from an elastic material.

11. An actuator mechanism (1) according to claim 1, wherein the retainer tip (5) of which the surface holding the actuator (3) is serrated to increase its retaining strength.

12. An actuator mechanism (1) according to claim 1, wherein the actuator (3) has at least one elastomeric film (7) with a dielectric structure and at least two conductive layers (8) coated on the elastomeric film (7) and enabling the elastomeric film (7) to change its shape under the electric field effect caused by a voltage applied to it by a control unit (K).

13. An actuator mechanism (1) as claimed in claim 12, wherein the conductive layer (8) is at least one of silicone/graphite, carbon conductive grease, carbon-based or silver grease material that, while maintaining its conductivity property, changes its form together with the elastomeric film (7) when the elastomeric film (7) changes its form.

14. An actuator mechanism (1) according to claim 1, comprising at least one control surface (9) located on a body (2) of an air vehicle and enabling control the air flow by making a relative movement with respect to the body (2) when the actuator (3) changes its form.

* * * * *